United States Patent [19]
Shelton et al.

[11] Patent Number: 5,825,199
[45] Date of Patent: Oct. 20, 1998

[54] REPROGRAMMABLE STATE MACHINE AND METHOD THEREFOR

[75] Inventors: Roger Shelton; Peter Chambers, both of Phoenix, Ariz.

[73] Assignee: VLSI Technology, Inc., San Jose, Calif.

[21] Appl. No.: 792,712

[22] Filed: Jan. 30, 1997

[51] Int. Cl.⁶ .............................................. H03K 19/173
[52] U.S. Cl. .................................. 326/38; 326/46; 326/93
[58] Field of Search ................................. 326/37, 38, 46, 326/93

[56] References Cited

U.S. PATENT DOCUMENTS

| | | |
|---|---|---|
| 3,721,838 | 3/1973 | Brickman et al. . |
| 4,551,814 | 11/1985 | Moore et al. . |
| 4,786,829 | 11/1988 | Letcher ..................................... 326/93 |
| 4,879,481 | 11/1989 | Pathak et al. ............................. 326/46 |
| 4,965,472 | 10/1990 | Anderson ................................. 326/46 |
| 5,042,004 | 8/1991 | Agrawal et al. . |
| 5,270,974 | 12/1993 | Reddy . |
| 5,412,260 | 5/1995 | Tsui et al. . |
| 5,650,734 | 7/1997 | Chu et al. ................................. 326/38 |

*Primary Examiner*—Jon Santamauro
*Assistant Examiner*—Don Phu Le
*Attorney, Agent, or Firm*—Harry M. Weiss; Jeffrey D. Moy; Harry M. Weiss & Associates, P.C.

[57] ABSTRACT

A reprogrammable state machine which allows the state flow and control outputs to be reprogrammed without requiring modification of the state machine. The reprogrammable state machine uses a reprogrammable logic unit to generate the state transitions and output transitions for each state of the reprogrammable state machine. A memory control unit is used to program the state machine reprogrammable logic unit with default settings for the state transitions and output transitions for each state of the reprogrammable state machine. The memory control unit is also used to reprogram the state machine reprogrammable logic unit with modified settings for the state transitions and output transitions for each state of the reprogrammable state machine which needs to be modified.

7 Claims, 1 Drawing Sheet

REPROGRAMMABLE STATE MACHINE AND METHOD THEREFOR

BACKGROUND OF THE INVENTION

1. Field of the Invention

This invention relates generally to state machines and, more specifically, to a reprogrammable state machine and method therefor which allows the state flow and control outputs to be reprogrammed without requiring modification of the state machine.

2. Description of the Prior Art

Presently, a great majority of silicon designs employ synchronous state machines to control the characteristics and the behavior of the silicon designs. The state machines are generally implemented in fixed logic and are usually synthesized from a high level design language.

In general, all state machines have a finite number of states. However, many state machines are extremely complex in nature having many different states wherein each state may have many different transitions and outputs based on the operating conditions of the state machine. Due to the elaborate nature of many state machines, it is difficult to test all possible corner cases of a state machine. As such, many times after a silicon design employing synchronous state machines has been implemented, it is discovered that one or more of the synchronous state machines has been wrongly designed. This creates a serious problem since the state machines used in these silicon designs are fixed and not modifiable after the silicon has been produced. Presently, the only way to modify the behavior of the state machine after the silicon is produced is to make changes to the interconnect layers of the die which is an extremely complex and difficult procedure.

Therefore, a need existed to provide a reprogrammable state machine. The reprogrammable state machine must be implemented using a minimal amount of silicon real estate. The mechanism for allowing reprogramming of the state machine must have a minimal affect on the timing and performance of the state machine since many state machines are very critical in timing. The programming mechanism must be flexible in that the programming mechanism must allow for the reprogramming of the behavior of the state machine arbitrarily within the limits of state bits, inputs and outputs, and using a reasonable number of logic terms. The programming mechanism also must be benign. If the programming mechanism is not in use, than the programming mechanism must not require any special support.

SUMMARY OF THE INVENTION

In accordance with one embodiment of the present invention, it is an object of the present invention to provide a reprogrammable state machine.

It is another object of the present invention to provide a reprogrammable state machine that is implemented using a minimal amount of silicon real estate.

It is another object of the present invention to provide a reprogrammable state machine wherein the mechanism used for reprogramming the state machine has a minimal affect on the timing and performance of the state machine.

It is still another object of the present invention to provide a reprogrammable state machine wherein the mechanism used for reprogramming the state machine is flexible in that the programming mechanism will allow for the reprogramming of the behavior of the state machine arbitrarily within the limits of the state bits, inputs and outputs, and using a reasonable number of logic terms.

It is still another object of the present invention to provide a reprogrammable state machine wherein the mechanism used for reprogramming the state machine is benign such that if the programming mechanism is not in use, then the programming mechanism will not require any special support.

BRIEF DESCRIPTION OF THE PREFERRED EMBODIMENTS

In accordance with one embodiment of the present invention, a reprogrammable state machine having a finite number of individual states is disclosed. The reprogrammable state machine allows for programming and reprogramming of state transitions and output transitions of each of the finite number of individual states. The reprogrammable state machine has state register means having an input coupled to a clock signal for storing and outputting a present state of the reprogrammable state machine. Output register means having an input coupled to the clock signal are used for storing and outputting a present output for the present state in which the reprogrammable state machine is presently operating under. A state machine reprogrammable logic unit is provided and has a first input coupled to an output of the state register means, a second input coupled to a device the reprogrammable state machine is to control, a first output coupled to an input of the state register means, and a second output coupled to an input of the output register means. The state machine reprogrammable logic unit may be programmed and reprogrammed to generate the state transition from a present state to a next state and to generate the output transition from a present output to a next output for each of the finite number of individual states of the reprogrammable state machine. Memory control means are coupled to the state machine reprogrammable logic unit for programming and reprogramming the state machine reprogrammable logic means with the state transition and the output transition for each of the finite number of individual states of the reprogrammable state machine.

In accordance with another embodiment of the present invention, a method of providing a reprogrammable state machine having a finite number of individual states which allows for programming and reprogramming of state transitions and output transitions of each of the finite number of individual states comprising the steps of: providing state register means having an input coupled to a clock signal for storing and outputting a present state of the reprogrammable state machine; providing output register means having an input coupled to the clock signal for storing and outputting a present output for the present state the reprogrammable state machine is operating under; providing state machine reprogrammable logic unit having a first input coupled to an output of the state register means, a second input coupled to a device the reprogrammable state machine is to control, a first output coupled to an input of the state register means, and a second output coupled to an input of the output register means wherein the state machine reprogrammable logic unit may be programmed and reprogrammed to generate the state transition from the present state to a next state and for generating the output transition from the present output to a next output for each of the finite number of individual states of the reprogrammable state machine; and providing memory control means coupled to the state machine reprogrammable logic unit for programming and reprogramming the state machine reprogrammable logic means with the state transition and the output transition for each of the finite number of individual states of the reprogrammable state machine.

DETAILED DESCRIPTION OF THE PREFERRED EMBODIMENTS

Figure 1:
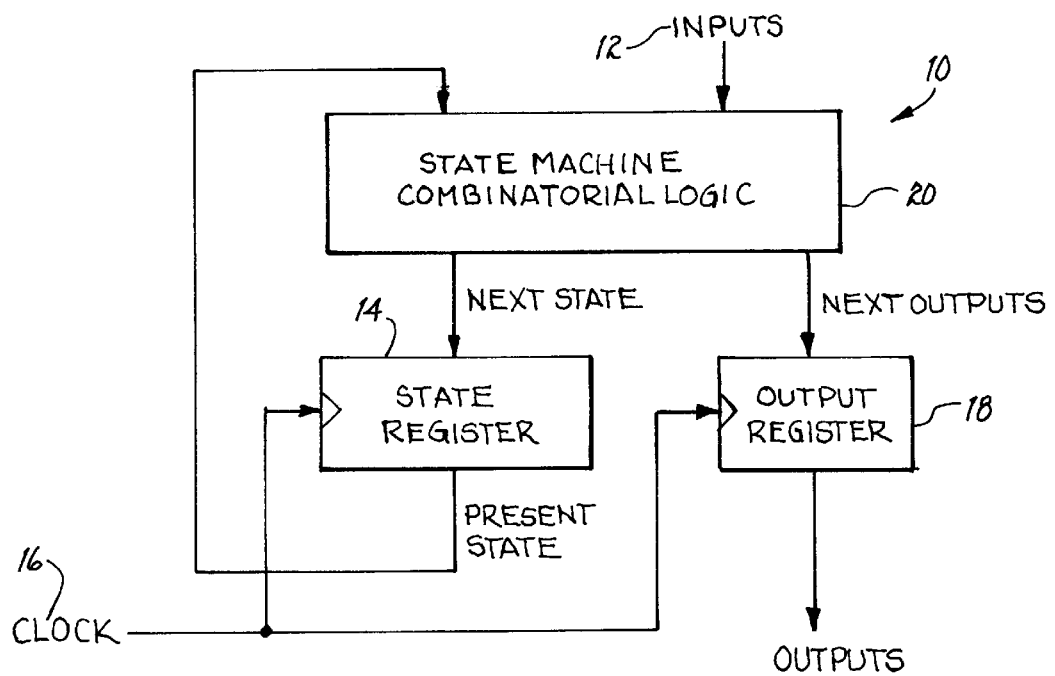
FIG. 1 is a simplified functional block diagram of a prior art synchronous state machine.

Referring to FIG. 1, a prior art synchronous state machine 10 (hereinafter state machine 10) is disclosed. Presently, a great majority of silicon designs employ state machines 10 to control the characteristics and the behavior of the silicon design. Generally speaking, the state machine 10 is a piece of sequential clocked digital logic. The state machine 10 is based on a finite number of sequences (i.e., states). The state machine 10 may exist in any one particular state at any one time. At each clock edge, the state machine will update the state the state machine 10 is currently at based on the present state of the state machine 10 and inputs 12 to the state machine 10.

The state machine 10 has a state register 14 which has an input coupled to a clock signal 16. The state register 14 is used for storing and outputting the present state of the state machine 10. At each edge of the clock signal 16, the state register 14 will be updated with a new present state of the state machine 10.

The state machine 10 also has an output register 18. Like the state register 14, the output register 18 has an input coupled to the clock signal 16. The output register 18 is used for storing and outputting the present output for the present state the state machine 10 is currently operating under. At each edge of the clock signal 16, the output register 18 will be updated with a new present output based on the new present state the state machine 10 is currently operating under and input 12 to the state machine 10.

Both the state register 14 and the output register 18 are updated by a state machine logic unit 20. The state machine logic unit 20 has a first input coupled to an output of the state register 14 and a second input coupled to an input 12. The input 12 is usually from a device (not shown) that the state machine 10 was designed to control. The state machine logic unit 20 further has a first output coupled to an input of the state register 14 and a second output coupled to an input of the output register 18. The state machine logic unit 20 is used for updating the state register 14 by generating a current transition from the present state to a next state and for updating the output register 18 by generating a current output transition from the current output to a next output for each of the finite number of individual states that the state machine 10 may operate under. The updated data received by the state register 14 and the output register 18 (i.e., next state and next output) are based on the inputs to the state machine logic unit 20 (i.e., the present state the state machine 10 is currently operating under and input 12 from the device whose characteristics and behavior the state machine 10 was designed to control).

The state machine logic unit 20 is implemented as a block of logic gates. The logic gates are of fixed logic, usually synthesized from a high-level design language. As such, the state machine 10 is generally fixed and not modifiable after the silicon has been produced except for extremely difficult procedures such as making changes to the interconnect layers of the die.

Figure 2:
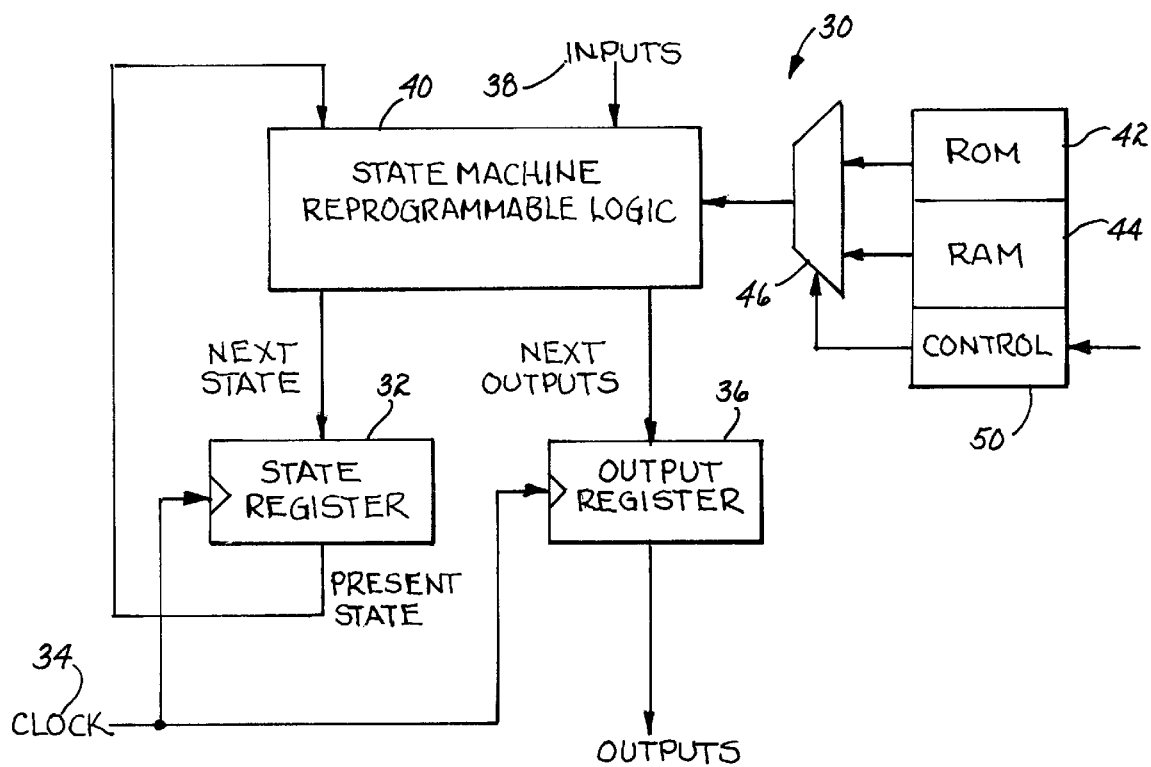
FIG. 2 is a simplified functional block diagram of the reprogrammable synchronous state machine of the present invention.

Referring to FIG. 2, a reprogrammable state machine 30 is shown. Like the prior art state machine 10, the reprogrammable state machine 30 has a state register 32 which has an input coupled to a clock signal 34. The state register 32 is used for storing and outputting the present state of the reprogrammable state machine 30. At each edge of the clock signal 34, the state register 32 will be updated with a new present state of the reprogrammable state machine 30. The new present state is based on the present state of the reprogrammable state machine 30 and input 38 to the reprogrammable state machine 30. In general, the input 38 is from a device (not shown) which the reprogrammable state machine was designed to control.

The reprogrammable state machine 30 also has an output register 36. Like the state register 32, the output register 36 has an input coupled to the clock signal 34. The output register 36 is used for storing and outputting the present output for the present state the reprogrammable state machine 30 is currently operating under. At each edge of the clock signal 34, the output register 36 will be updated with a new present output. The new present output is based on the new present state the reprogrammable state machine 30 is currently operating under and input 38 to the reprogrammable state machine 30.

The state register 32 and the output register 36 are updated by a state machine reprogrammable logic unit 40. The state machine reprogrammable logic unit 40 has a first input coupled to an output of the state register 32 and a second input coupled to an input 38. As stated above, the input 38 is generally coupled to a device (not shown) that the reprogrammable state machine 30 was designed to control. The state machine reprogrammable logic unit 40 further has a first output coupled to an input of the state register 32 and a second output coupled to an input of the output register 36. The state machine reprogrammable logic unit 40 is used for updating the state register 32 by generating a state transition from the present state to a next state and for updating the output register 36 by generating an output transition from the current output to a next output for each of the finite number of individual states of the reprogrammable state machine 30. The updated data received by the state register 32 and the output register 36 (i.e., next state and next output) are based on the inputs to the state machine logic unit 38 (i.e., the present state the reprogrammable state machine 30 is currently operating under and input 38 from the device whose characteristics and behavior the reprogrammable state machine unit 30 was designed to control).

The state machine reprogrammable logic unit 40 may be programmed and reprogrammed to generate the state transitions and the output transitions for each of the finite number of individual states of the reprogrammable state machine 30. In one embodiment, the state machine reprogrammable logic unit 40 is a programmable logic array (PLA). Preferably, the PLA is a standard sum of products PLA. A standard sum of products PLA is preferred since it represents the best compromise between silicon area and flexibility. However, other PLAs besides the standard sum of products PLA could be used. For example, a user programmable Random Access Memory (RAM) based PLA may be used. However, if the behavior of the reprogrammable state machine unit 30 is speed critical, then a RAM based PLA may not be fast enough.

A Read Only Memory (ROM) unit 42 is coupled to the state machine reprogrammable logic unit 40. The ROM unit 42 is used for programming the state machine reprogrammable logic unit 40 with default values for the state transitions and the output transitions for each of the finite number of individual states of the reprogrammable state machine 30.

A Random Access Memory (RAM) unit 44 is also coupled to the state machine reprogrammable logic unit 40. The RAM unit 44 is used for reprogramming the state machine reprogrammable logic unit 40. If the default values set for the state transitions or the output transitions for any of the states are found to be in error, or if enhancements are required, the RAM unit may be used to reprogram the state machine reprogrammable logic unit 40 to modify one or more of the states of the reprogrammable state machine 30 from the default values set by the ROM unit 42 to new modified values.

The state machine reprogrammable logic unit 40 uses a multiplexer 46 to switch between the ROM unit 42 and the RAM unit 44. The multiplexer 46 has an output coupled to the state machine reprogrammable logic unit 40, a first input coupled to an output of the ROM unit 42, and a second input coupled to an output of the RAM unit 44.

Under normal operation, the state machine reprogrammable logic unit 40 will output the next state and the next output which are defined by the ROM unit 42 and are based on the current state of the reprogrammable state machine 30 and the input 38 from the device the reprogrammable state machine 30 is designed to control. If the state transition and/or the output transition of the present state or any of the other states needs to be modified, the multiplexer 46 will be signaled to switch to the RAM unit 44 so that the RAM unit 44 may reprogram the state machine reprogrammable logic unit 40. The RAM unit 44 will reprogram the state machine reprogrammable logic unit 40 so that the default values set by the ROM unit 42 for the state transition and/or the output transition will be modified to modified values which are defined in the RAM unit 44 by the user.

A control unit 50 is coupled to the RAM unit 44 and to the multiplexer 46. The control unit 50 is used for loading the RAM unit with the modified values for the state transitions and/or output transitions for each state which needs to be modified. The multiplexer 46 is also used for controlling switching of the multiplexer 46 from the default values set by the ROM unit 42 for the unmodified individual states of the reprogrammable state machine 30 to the modified values set by the RAM unit 44 for the individual states of the reprogrammable state machine 30 which need to be modified.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A reprogrammable state machine having a finite number of individual states which allows for programming and reprogramming of state transitions and output transitions of each of said finite number of individual states of said reprogrammable state machine comprising, in combination:

state register means having an input coupled to a clock signal for storing and outputting a present state said reprogrammable state machine is operating under;

output register means having an input coupled to said clock signal for storing and outputting a present output for said present state said reprogrammable state machine is operating under;

state machine reprogrammable logic unit having a first input coupled to an output of said state register means, a second input coupled to a device said reprogrammable state machine is to control, a first output coupled to an input of said state register means, and a second output coupled to an input of said output register means wherein said state machine reprogrammable logic unit may be programmed and reprogrammed to generate said state transition from said present state to a next state and for generating said output transition from said present output to a next output for each of said finite number of individual states of said reprogrammable state machine, wherein said state machine reprogrammable logic unit is a sum-of-products programmable logic array; and memory control means coupled to said state machine reprogrammable logic unit for programming and reprogramming said state machine reprogrammable logic means with said state transition and said output transition for each of said finite number of individual states of said reprogrammable state machine.

2. The reprogrammable state machine of claim 1 wherein said memory control means comprises:

Read Only Memory (ROM) means coupled to said state machine reprogrammable logic unit for programming said state machine reprogrammable logic unit with default values for said state transition and said output transition for each of said finite number of individual states of said reprogrammable state machine;

Random Access Memory (RAM) means coupled to said state machine reprogrammable logic unit for reprogramming said state machine reprogrammable logic unit to modify individual states of said reprogrammable state machine from said default values set by said ROM means to modified values;

multiplexer means having an output coupled to said state machine reprogrammable logic unit, a first input coupled to an output of said ROM means, and a second input coupled to an output of said RAM means for allowing said state machine reprogrammable logic unit to output for each of said finite number of states at least one of said default values set by said ROM means for unmodified individual states of said reprogrammable state machine and said modified values set by said RAM means for said modified individual states of said reprogrammable state machine; and control means coupled to said RAM means and to said multiplexer means for controlling programming of said RAM means to load said modified values of said modified individual states to said RAM means and for controlling switching of said multiplexer means from said default values set by said ROM means for said unmodified individual states of said reprogrammable state machine to said modified values set by said RAM means for said modified individual states of said reprogrammable state machine.

3. A reprogrammable state machine having a finite number of individual states which allows for programming and reprogramming of state transitions and output transitions of each of said finite number of individual states of said reprogrammable state machine comprising, in combination:

state register means having an input coupled to a clock signal for storing and outputting a present state said reprogrammable state machine is operating under;

output register means having an input coupled to said clock signal for storing and outputting a present output for said present state said reprogrammable state machine is operating under;

state machine reprogrammable logic unit having a first input coupled to an output of said state register means, a second input coupled to a device said reprogrammable state machine is to control, a first output coupled to an input of said state register means, and a second output coupled to an input of said output register means wherein said state machine reprogrammable logic unit may be programmed and reprogrammed to generate said state transition from said present state to a next state and for generating said output transition from said present output to a next output for each of said finite number of individual states of said reprogrammable state machine; and memory control means coupled to said state machine reprogrammable logic unit for loading said state machine reprogrammable logic means with said state transition and said output transition for each of said finite number of individual states of said reprogrammable state machine, said memory control means comprising:

Read Only Memory (ROM) means coupled to said state machine reprogrammable logic unit for programming said state machine reprogrammable logic unit with default values for said state transition and said output transition for each of said finite number of individual states of said reprogrammable state machine;

Random Access Memory (RAM) means coupled to said state machine reprogrammable logic unit for reprogramming said state machine reprogrammable logic unit to modify individual states of said reprogrammable state machine from said default values set by said ROM means to modified values;

multiplexer means having an output coupled to said state machine reprogrammable logic unit, a first input coupled to an output of said ROM means, and a second input coupled to an output of said RAM means for allowing said state machine reprogrammable logic unit to output for each of said finite number of states at least one of said default values set by said ROM means for unmodified individual states of said reprogrammable state machine and said modified values set by said RAM means for said modified individual states of said reprogrammable state machine; and control means coupled to said RAM means and to said multiplexer means for controlling programming of said RAM means to load said modified values of said modified individual states to said RAM means and for controlling switching of said multiplexer means from said default values set by said ROM means for said unmodified individual states of said reprogrammable state machine to said modified values set by said RAM means for said modified individual states of said reprogrammable state machine.

4. The reprogrammable state machine of claim 3 wherein said state machine reprogrammable logic is a programmable logic array.

5. The reprogrammable state machine of claim 4 wherein said programmable logic array is a standard sum-of-products programmable logic array.

6. A method of providing a reprogrammable state machine having a finite number of individual states which allows for programming and reprogramming of state transitions and output transitions of each of said finite number of individual states of said reprogrammable state machine comprising the steps of:

providing state register means having an input coupled to a clock signal for storing and outputting a present state said reprogrammable state machine is operating under;

providing output register means having an input coupled to said clock signal for storing and outputting a present output for said present state said reprogrammable state machine is operating under;

providing state machine reprogrammable logic unit having a first input coupled to an output of said state register means, a second input coupled to a device said reprogrammable state machine is to control, a first output coupled to an input of said state register means, and a second output coupled to an input of said output register means wherein said state machine reprogrammable logic unit may be programmed and reprogrammed to generate said state transition from said present state to a next state and for generating said output transition from said present output to a next output for each of said finite number of individual states of said reprogrammable state machine, wherein said state machine reprogrammable logic unit is a sum-of-products programmable logic array; and providing memory control means coupled to said state machine reprogrammable logic unit for programming and reprogramming said state machine reprogrammable logic means with said state transition and said output transition for each of said finite number of individual states of said reprogrammable state machine.

7. The method of claim 6 wherein said step of providing memory control means further comprises the steps of:

providing Read Only Memory (ROM) means coupled to said state machine reprogrammable logic unit for programming said state machine reprogrammable logic unit with default values for said state transition and said output transition for each of said finite number of individual states of said reprogrammable state machine;

providing Random Access Memory (RAM) means coupled to said state machine reprogrammable logic unit for reprogramming said state machine reprogrammable logic unit to modify individual states of said reprogrammable state machine from said default values set by said ROM means to modified values;

providing multiplexer means having an output coupled to said state machine reprogrammable logic unit, a first input coupled to an output of said ROM means, and a second input coupled to an output of said RAM means for allowing said state machine reprogrammable logic unit to output for each of said finite number of states at least one of said default values set by said ROM means for unmodified individual states of said reprogrammable state machine and said modified values set by said RAM means for said modified individual states of said reprogrammable state machine; and providing control means coupled to said RAM means and to said multiplexer means for controlling programming of said RAM means to load said modified values of said modified individual states to said RAM means and for controlling switching of said multiplexer means from said default values set by said ROM means for said unmodified individual states of said reprogrammable state machine to said modified values set by said RAM means for said modified individual states of said reprogrammable state machine.

* * * * *